US012529385B2

(12) United States Patent
Buffat et al.

(10) Patent No.: US 12,529,385 B2
(45) Date of Patent: Jan. 20, 2026

(54) MULTI-STAGE VACUUM GENERATOR

(71) Applicant: COVAL, Montelier (FR)

(72) Inventors: Emmanuel Buffat, Mauves (FR); Pierre-Louis Bal, Mirabel-Et-Blacons (FR); Michel Cecchin, Montelier (FR); Pierre Milhau, Chatuzange-le-Goubet (FR)

(73) Assignee: COVAL, Montelier (FR)

( * ) Notice: Subject to any disclaimer, the term of this patent is extended or adjusted under 35 U.S.C. 154(b) by 47 days.

(21) Appl. No.: 18/573,940

(22) PCT Filed: Jun. 23, 2022

(86) PCT No.: PCT/IB2022/000462
§ 371 (c)(1),
(2) Date: Dec. 22, 2023

(87) PCT Pub. No.: WO2022/269363
PCT Pub. Date: Dec. 29, 2022

(65) Prior Publication Data
US 2024/0426321 A1   Dec. 26, 2024

(30) Foreign Application Priority Data
Jun. 24, 2021 (FR) ........................... 2106753

(51) Int. Cl.
*F04F 5/22* (2006.01)
(52) U.S. Cl.
CPC ........... *F04F 5/22* (2013.01); *Y10T 137/2599* (2015.04); *Y10T 137/7789* (2015.04)

(58) Field of Classification Search
CPC . F04F 5/22; Y10T 137/2599; Y10T 137/7789
See application file for complete search history.

(56) References Cited

U.S. PATENT DOCUMENTS 1,406,145 A * 2/1922 Blauhorn ................ F04F 5/466
417/196
1,804,569 A   5/1931 Taddiken
(Continued)

FOREIGN PATENT DOCUMENTS

DE      102007004590 A1    7/2008
EP          2574796 A1 *   4/2013  ............... F04F 5/22
WO       WO01/20170 A1    3/2001

*Primary Examiner* — Hailey K. Do
(74) *Attorney, Agent, or Firm* — MUNCY, GEISSLER, OLDS & LOWE, P.C.

(57) ABSTRACT

A vacuum generator including a cluster of multi-stage venturi cells, each having a nozzle which is sealingly secured in an inlet orifice of a first mixer provided with a first suction orifice, and a second mixer fixed to the first mixer in such a manner that the second mixer extends coaxially to the first mixer and is spaced apart from an outlet orifice of said first mixer in order to form with the same a second suction orifice, characterized in that the first mixers are firmly interconnected by a first frame extending between the first suction orifices and the outlet orifices of the first mixers to form a first sealing surface surrounding said first mixers, and the second mixers are firmly interconnected by a second frame extending between the inlet orifices and the outlet orifices of the second mixers to form a second sealing surface surrounding said second mixers.

7 Claims, 7 Drawing Sheets

(56) References Cited

U.S. PATENT DOCUMENTS

| | | | | |
|---|---|---|---|---|
| 3,959,864 A | * | 6/1976 | Tell | F04F 5/22 |
| | | | | 417/174 |
| 4,696,625 A | * | 9/1987 | Greenberg | F04F 5/22 |
| | | | | 417/174 |
| 5,205,717 A | * | 4/1993 | Tell | F04F 5/22 |
| | | | | 417/189 |
| 6,220,578 B1 | | 4/2001 | Popov | |
| 8,231,358 B2 | * | 7/2012 | Cho | F04F 5/22 |
| | | | | 417/189 |

* cited by examiner

MULTI-STAGE VACUUM GENERATOR

The invention relates to a vacuum generator implementing multi-stage venturi cells, in particular for handling by the vacuum.

BACKGROUND OF THE INVENTION

The multi-stage vacuum generators generally comprise up to four venturi cells mounted in parallel. Each venturi cell comprises, as schematically illustrated in FIG. 1, a nozzle B which is intended to be connected to a compressed air supply circuit, and which opens into a first suction chamber C1 and facing a first mixer M1. The first mixer M1 receives air coming from the nozzle B which, by passing through the first chamber C1, suctions the air present in said first chamber C1. In the same way, the air coming from the first mixer M1 passes through a second suction chamber C2 and is received by a second mixer M2. The air coming from the second mixer passes through a third suction chamber C3 and is received by a third mixer M3, the air coming from the third mixer M3 opening into the atmosphere. The second and third chambers C2, C3 are connected to the first chamber C1 through one-directional valves K2, K3 making it possible to obtain a maximum vacuum level. The suctioned flow rate of the venturi cell is equal to the sum of the suctioned flow rates of each stage formed by the suction chambers C1, C2, C3.

Such an arrangement thus makes it possible to improve the suctioning flow rate of the venturi cells, while reducing their compressed air consumption.

From document EP 2 827 004, a cartridge-type three-stage venturi cell is known. This comprises a socket provided radially with suction orifices and wherein are inserted, on one side, a nozzle and on the opposite side, an assembly of three mixers made of one single piece. Check valves are disposed between the nozzle and the mixers, facing the suction orifices.

If the number of components of such a venturi cell is limited, the inlets of the mixers cannot benefit from fillets, which has the effect of restraining the suction performance of the venturi cell. Moreover, such an arrangement of mixers involves a significant number of seals to ensure the sealing of each stage on the one hand, and the sealing between the socket and the mixers on the other hand, which favours the risks of leaks.

The valves are further necessarily of small sizes, and therefore have proved to be particularly fragile and sensitive to soiling, which tends to decrease the suction flow rate of the venturi cells. Their mounting or their replacement can also prove to be constraining.

Also, a three-stage venturi cell is known from document EP 1 064 464, wherein mixers are sealingly secured in one another and comprise radial slots forming suction orifices. The slots are equipped with check valves arranged between the mixers.

If such a venturi cell has a mainly cylindrical body enabling an easy insertion in a vacuum pump body, it requires, as is described above, a significant number of seals to ensure the sealing between each stage and each mixer.

Likewise, the valves are necessarily of small sizes and have therefore been proved to be particularly fragile and sensitive to soiling which tends to decrease the suction flow rate of the venturi cells. In addition, their replacement can prove to be constraining.

Such cells are further dismountable, which can be a source of malfunction, in particular when one of the seals or one of the valves is forgotten during a remounting.

What is more, the use of individual venturi cells such as described in documents EP 2 827 004 and EP 1 064 464, requires the mounting and the dismounting of each of the cells inserted in the pump body, which increases the manufacturing time of the pump more, like that of its maintenance.

AIM OF THE INVENTION

The invention therefore aims to propose a multi-stage vacuum generator, at least partially averting the abovementioned problems.

SUMMARY OF THE INVENTION

To this end, a vacuum generator is proposed, comprising a cluster of multi-stage venturi cells, each comprising a nozzle sealingly secured in an inlet orifice of a first mixer provided with a first suction orifice, and a second mixer fixed to the first mixer, in such a manner that the second mixer extends coaxially to the first mixer and is spaced apart from an outlet orifice of said first mixer in order to form a second suction orifice with it.

According to the invention, the first mixers are firmly interconnected by a first frame extending between the first suction orifices and the outlet orifices of the first mixers, in order to form a first sealing surface surrounding said first mixers, and the second mixers are firmly interconnected by a second frame extending between inlet orifices and outlet orifices of the second mixers, in order to form a second sealing surface surrounding said second mixers.

Such a cluster makes it possible to limit the number of seals to ensure the sealing between each stage, which makes it possible to limit the risks of leaks and of malfunction of the vacuum generator 1. What is more, the mounting and the dismounting of the venturi cells are facilitated, the assembly of the venturi cells being inserted of one single piece in the vacuum generator.

Particularly, the venturi cells extend parallel to one another.

Particularly, the venturi cells extend in one same plane.

Particularly, the vacuum generator comprises a first seal and a second seal, respectively carried by the first frame and the second frame.

Thus, preferably, the first seal and the second seal are lip seals.

Particularly, each venturi cell further comprises a third mixer fixed to the second mixer, in such a manner that the third mixer extends coaxially to the second mixer and is spaced apart from an outlet orifice of said second mixer in order to form a third suction orifice with it, the third mixers being firmly interconnected by a third frame extending between inlet orifices and outlet orifices of the third mixers, in order to form a third sealing surface surrounding said third mixers.

BRIEF DESCRIPTION OF THE DRAWINGS

The invention will be best understood in the light of the description below, which is purely illustrative and non-limiting, and must be read regarding the accompanying figures, among which.

DETAILED DESCRIPTION OF THE INVENTION

Figure 1:
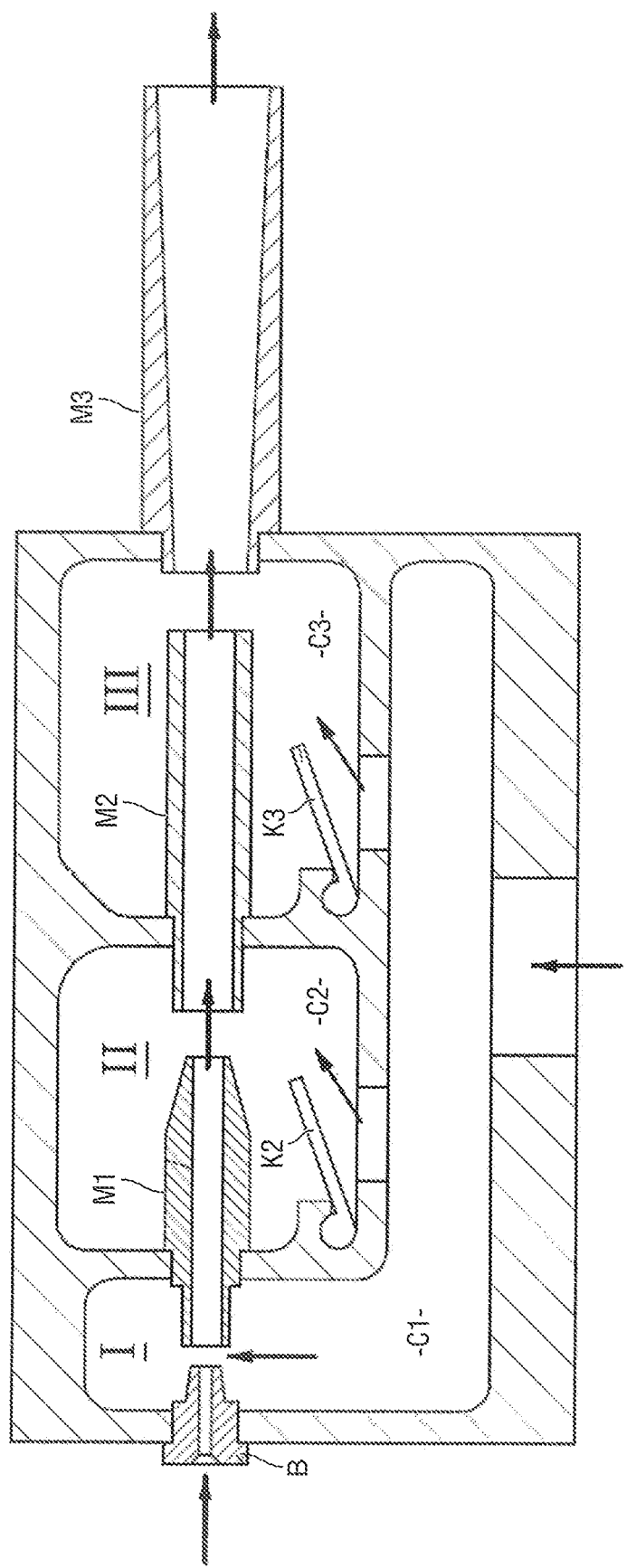
FIG. 1 is a schematic view of a multi-stage venturi cell according to the prior art.
Figure 2:
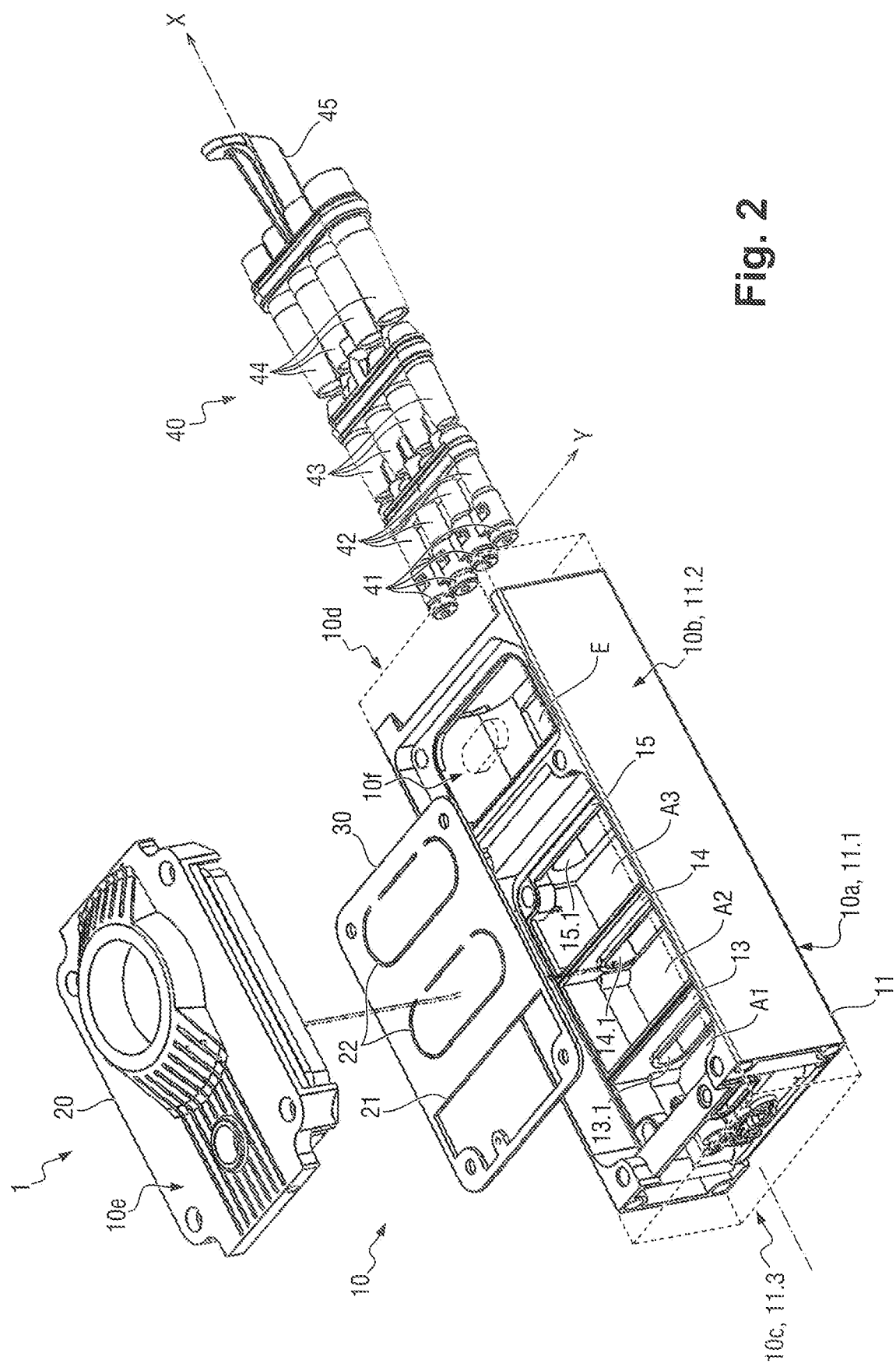
FIG. 2 is a partial exploded view of a multi-stage vacuum generator according to a particular embodiment of the invention.

In reference to FIG. 2, a vacuum generator 1 according to the invention comprises a rectangular parallelepiped-shaped casing 10 and a cluster 40 of venturi cells housed inside the casing 10.

The casing 10 comprises a main body 11 comprising a bottom 11.1, two side walls 11.2 having a lower edge connected to a side edge of the bottom 11.1, and a front wall 11.3 having a lower edge connected to a front edge of the bottom 11.1 and side edges connected to front edges of the side walls 11.2. The bottom 11.1 and the side walls 11.2 extend about a longitudinal axis X of the casing 10 and respectively define a lower face 10a and side faces 10b of the casing 10.

A compressed air supply flange (schematised as a dotted line) is fixed on the front wall 11.3 of the body and defines a front face 10c of the casing 10 intended to be connected to a pressurised air source. A rear face 10d of the casing 10 is defined by a flange for immobilising the cluster 40 of venturi cells (schematised as a dotted line) fixed to the rear of the body 11. A suction flange 20 and an exhaust flange (schematised as a dotted line) are fixed on the top of the body 11 and respectively define a first upper face 10e and a second upper face 10f of the casing 10. The suction flange 20 is intended to be connected to an enclosure needing to be vacuumed, and the exhaust flange is intended to be connected to the atmosphere. An elastomer membrane 30 is compressed between the body 11 and the suction flange 20 and defined with it, a vacuum collection chamber V.

The body 11 further comprises four substantially parallel partitions 12, 13, 14, 15 and connecting the side walls 11.2 to one another. The partitions 12, 13, 14, 15 each extend into a plane substantially perpendicular to the longitudinal axis X of the casing 10.

Figure 3:
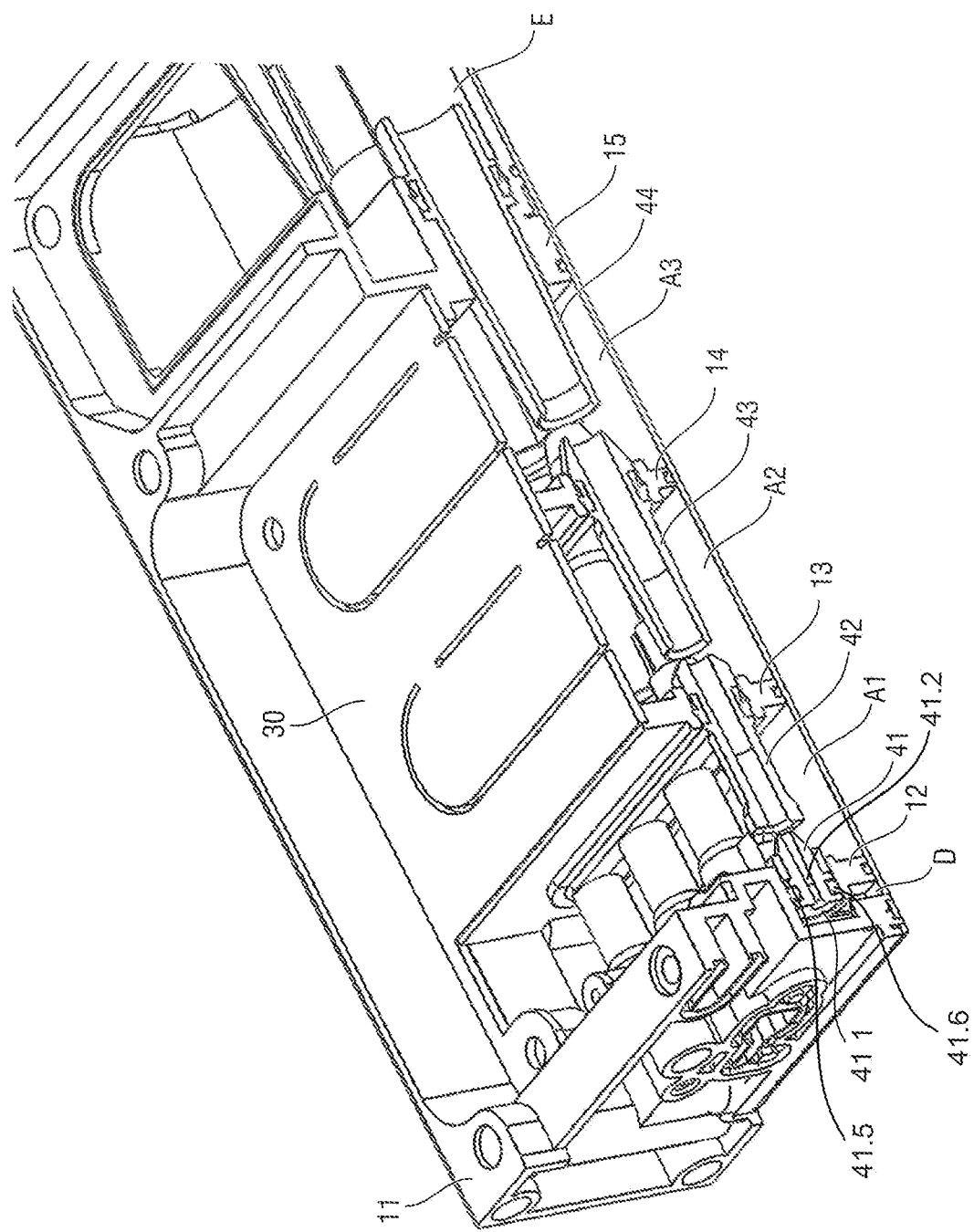
FIG. 3 is a partial cross-sectional view of the vacuum generator illustrated in FIG. 2.

As illustrated in FIG. 3, the first partition 12 defines, with the bottom 11.1, the side walls 11.2 and the front wall 11.3 of the body 11, a compressed air distribution chamber D. The first partition 12 and the second partition 13 define, with the bottom 11.1, the side walls 11.2, the front wall 11.3 and the membrane 30, a first suction chamber A1. The second partition 13 and the third partition 14 define, with the bottom 11.1, the side walls 11.2, the front wall 11.3 and the membrane 30, a second suction chamber A2. The third partition 14 and the fourth partition 15 define, with the bottom 11.1, the side walls 11.2, the front wall 11.3 and the membrane 30, a third suction chamber A3. The fourth partition 15 defines, with the bottom 11.1, the side walls 11.2, the immobilisation flange and the exhaust flange, an exhaust collection chamber E.

The first suction chamber A1 is in fluid communication with the vacuum collection chamber V through an opening 21 provided in the membrane 30.

The second suction chamber A2 and the third suction chamber A3 are in fluid communication with the vacuum collection chamber V through two openings provided with check valves 22 oriented in order to enable a fluid flow from the vacuum collection chamber V to the second suction chamber A2 or the third suction chamber A3, and to block it if the flow direction is inverted. The partition 12 is provided with four orifices arranged to split the compressed air into four currents entering into the distribution chamber D through the supply flange, and to sealingly secure end portions of the cluster 40 of venturi cells inside the casing 10. The orifices are cylindrically-shaped and extend about the longitudinal axis X of the casing, the centre of the orifices extending about a transverse axis Y perpendicular to the axis X.

The partitions 13, 14, 15 delimiting the second and third suction chambers A2, A3 are provided with an orifice 13.1, 14.1, 15.1 arranged to sealingly secure intermediate portions of the cluster 40 of venturi cells inside the casing 10. The orifices 13.1, 14.1, 15.1 are coaxial and have an oblong-shaped cross-section along a plane perpendicular to the axis X, the orifice 13.1 of the second partition 13 having dimensions slightly less than those of the orifice 14.1 of the third partition 14, which are themselves slightly less than those of the orifice 15.1 of the fourth partition 15.

Figure 4:
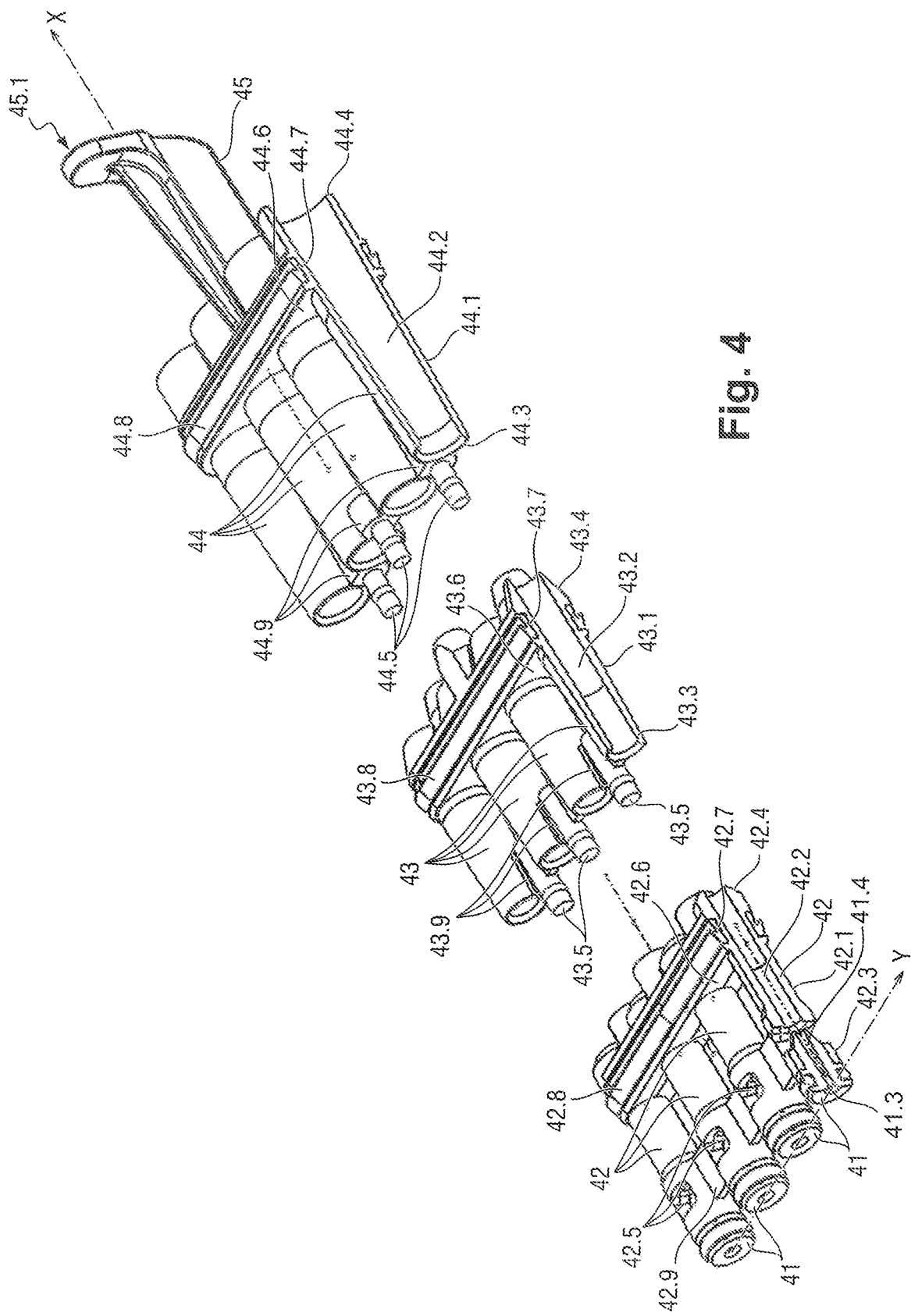
FIG. 4 is an exploded view of a cluster of multi-stage venturi cells forming part of the vacuum generator illustrated in FIG. 2.
Figure 5:
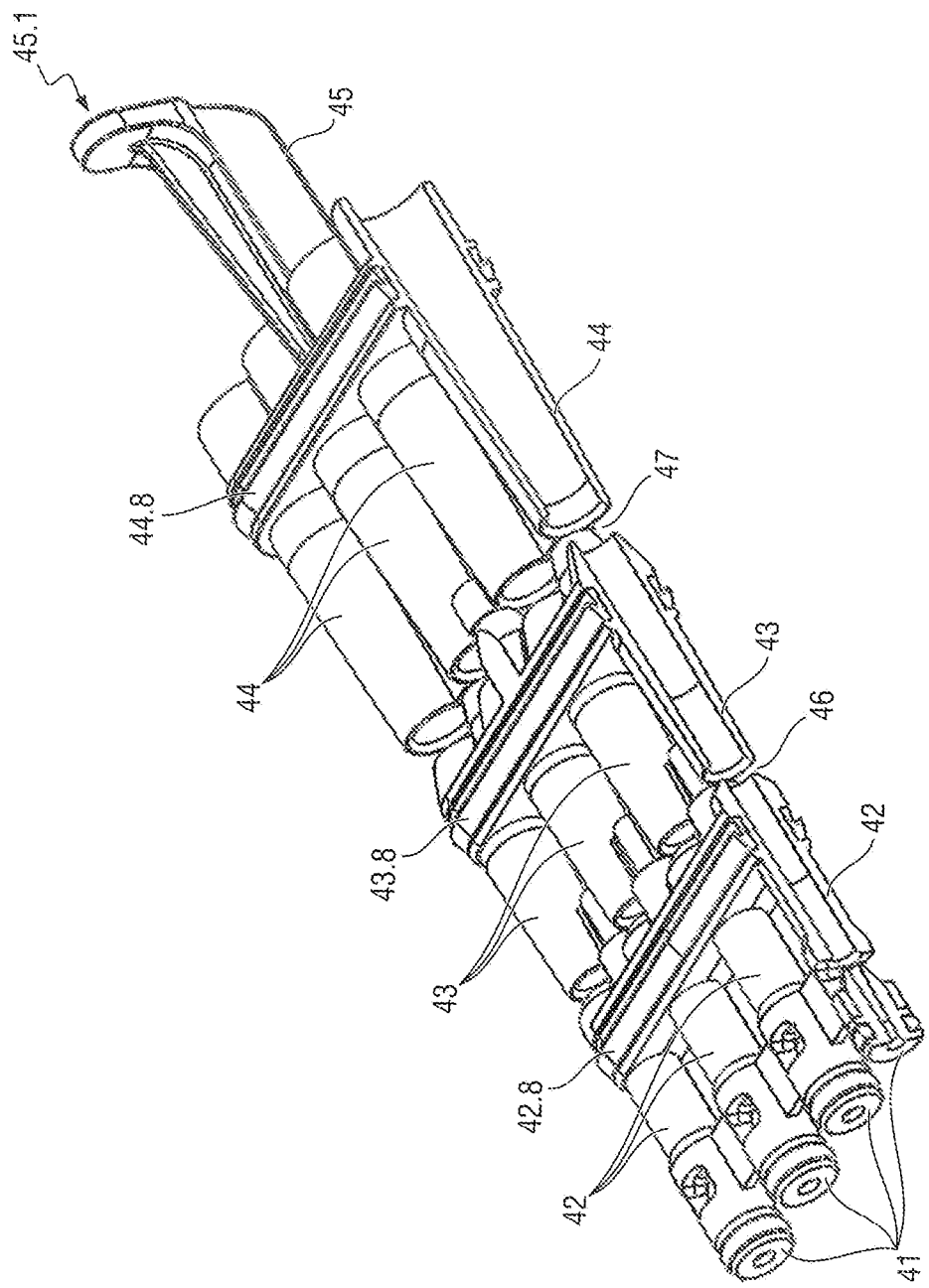
FIG. 5 is a cross-sectional view of the cluster of multi-stage venturi cells illustrated in FIG. 4.

In reference to FIGS. 4 and 5, the cluster 40 of venturi cells comprises a set of four nozzles 41, a set of four first mixers 42, a set of four second mixers 43 and a set of four third mixers 44.

The first mixers 42 comprise a tubular body 42.1 delimiting a channel 42.2 opening onto an inlet orifice 42.3 and an outlet orifice 42.4 of the first mixer 42. The outlet orifice 42.4 has a diameter slightly greater than that of the inlet orifice 42.3. The bodies 42.1 are provided with two diametrically opposite radial slots forming first suction orifices 42.5.

The first mixers 42 extend parallel to the axis X in the plane XY in order to form a first row of mixers. The first mixers 42 are firmly interconnected to one another by a frame 42.6 extending to the proximity of the outlet orifices 42.4 and arranged to form a first oblong-shaped sealing surface 42.7 surrounding all of the first mixers 42. The first sealing surface 42.7 receives a first lip seal 42.8, in this case made of elastomer material, which is intended to engage with the orifice 13.1 of the second partition 13 extending inside the casing 10 to ensure a sealing between the first and second suction chambers A1, A2 (FIG. 3). Stiffeners 42.9 extending at the first suction orifices 42.5 of the first mixers 42 connect said first mixers 42 in pairs in the plane XY.

The nozzles 41 are identical and are sealingly secured in the inlet orifices 42.3 of the first mixers 42. To this end, the nozzles 41 comprise a tubular body 41.1 comprising an annular external shoulder 41.5 forming an abutment at an insertion of the nozzle 41 in the inlet orifice 42.3 of the first mixer 42. The body 41.1 delimits a spraying channel 41.2 for the circulation of compressed air through the nozzle 41. The channels 41.2 opens onto an inlet orifice 41.3 and an outlet orifice 41.4 of the nozzle 41. The outlet orifice 41.4 has a diameter slightly greater than that of the inlet orifice 41.3. The channels 41.2 of the nozzles 41 extend coaxially to the channels 42.2 of the first mixers 42 and open to the first suction orifices 42.5 of said first mixers 42.

The nozzles 41 have a free end provided with an O-ring 41.6 intended to engage with the cylindrical orifices of the first partition 12 to ensure a sealing between the distribution chamber D and the first suction chamber A1.

The second mixers 43 comprise a tubular body 43.1 delimiting a channel 43.2 opening onto an inlet orifice 43.3 and an outlet orifice 43.4 of the second mixer 43. The outlet orifice 43.4 has a diameter slightly greater than that of the inlet orifice 43.3, which is itself slightly greater than that of the outlet orifice 42.4 of the first mixers 42.

The second mixers 43 extend parallel to the axis X in the plane XY, in order to form a second row of mixers. The second mixers 43 are firmly interconnected to one another by a frame 43.6 extending to the proximity of the outlet orifices 43.4 and arranged to form a second oblong-shaped sealing surface 43.7 surrounding all of the second mixers 43. The second sealing surface 43.7 receives a second lip seal 43.8, in this case, made of elastomer material, which is intended to engage with the orifice 14.1 of the third partition 14 extending inside the casing 10 to ensure a sealing between the second and third suction chambers A2, A3 (FIG. 3). Stiffeners 43.9 extending to the proximity of the inlet orifices 43.3 of the second mixers 43 connect said second mixers 43 in pairs in the plane XY. Stiffeners 43.9 comprise posts 43.5 arranged to form means for indexing and fixing second mixers 43 on the first mixers 42 in such a manner that the channels 43.2 of the second mixers 43 extend coaxially to the channels 42.2 of the first mixers 42, and that the inlet orifices 43.3 of the second mixers 43 are spaced apart from the outlet channels 42.2 of the first mixers 42 to form second suction orifices 46.

The third mixers 44 comprise a tubular body 44.1 delimiting a channel 44.2 opening onto an inlet orifice 44.3 and an outlet orifice 44.4 of the second mixer 43. The outlet orifice 44.4 has a diameter slightly greater than that of the inlet orifice 44.3, which is itself slightly greater than that of the outlet orifice 43.4 of the second mixers 43.

The third mixers 44 extend parallel to the axis X in the plane XY in order to form a third row of mixers. The third mixers 44 are firmly interconnected to one another by a frame 44.6 extending to the proximity of the outlet orifices 44.4 and arranged to form a third oblong-shaped sealing surface 44.7 surrounding all of the third mixers 44. The third sealing surface 44.7 receives a third lip seal 44.8, in this case, made of elastomer material, which is intended to engage with the orifice 15.1 of the fourth partition 15 extending inside the casing 10 to ensure a sealing between the third chamber A3 and the exhaust chamber E (FIG. 3). Stiffeners 44.9 extending to the proximity of the inlet orifices 44.3 of the third mixers 44 connect said third mixers 44 in pairs in the plane XY. The stiffeners 44.9 comprise posts 44.5 arranged to form means for indexing and fixing third mixers 44 on the second mixers 43 in such a manner that the channels 44.2 of the third mixers 44 extend coaxially to the channels 43.2 of the second mixers 43, and that the inlet orifices 44.3 of the third mixers 44 are spaced apart from the outlet orifices 43.4 of the second mixers 43 to form third suction orifices 47.

An immobilising arm 45 is firmly interconnected to the frame 44.6 supporting the third mixers 44 and extends about the axis X projecting from the outlet orifices 44.4 of said third mixers 44. The arm 45 comprises, at a free end, a bearing surface 45.1 intended to be in contact with an internal surface of the immobilising flange forming the rear face 10d of the casing 10.

The set of first mixers 42, the set of second mixers 43 and the set of third mixers 44 are assembled in series by way of posts 43.5, 44.5 and form with the nozzles 41, the cluster 40 composed of four three-stage venturi cells.

The cluster 40 of venturi cells is inserted according to the axis X inside the casing 10 until abutment. The O-rings 41.6 of the nozzles thus engage with the cylindrical orifices of the first partition 12 and ensure the sealing between the distribution chamber D and the first suction chamber A1. At the same time, the lip seals 42.8, 43.8, 44.8 engage with the oblong-shaped orifices 13.1, 14.1, 15.1 of the partitions 13, 14, 15 and ensure the sealing between the suction chambers A1, A2, A3 and the exhaust chamber E. The fixing of the immobilising flange to the rear of the body 11 causes a contact between said immobilising flange and the surface 45.1 of the arm 45 of the cluster, and therefore an immobilisation in translation about the axis X of the cluster 40 of venturi cells inside the casing 10.

Such an arrangement of the cluster 40 enables a tool-free mounting and dismounting of it inside the casing. It also facilitates the cleaning or the replacement of the cluster 40 rapidly making the vacuum generator 1 operational.

Figure 6:
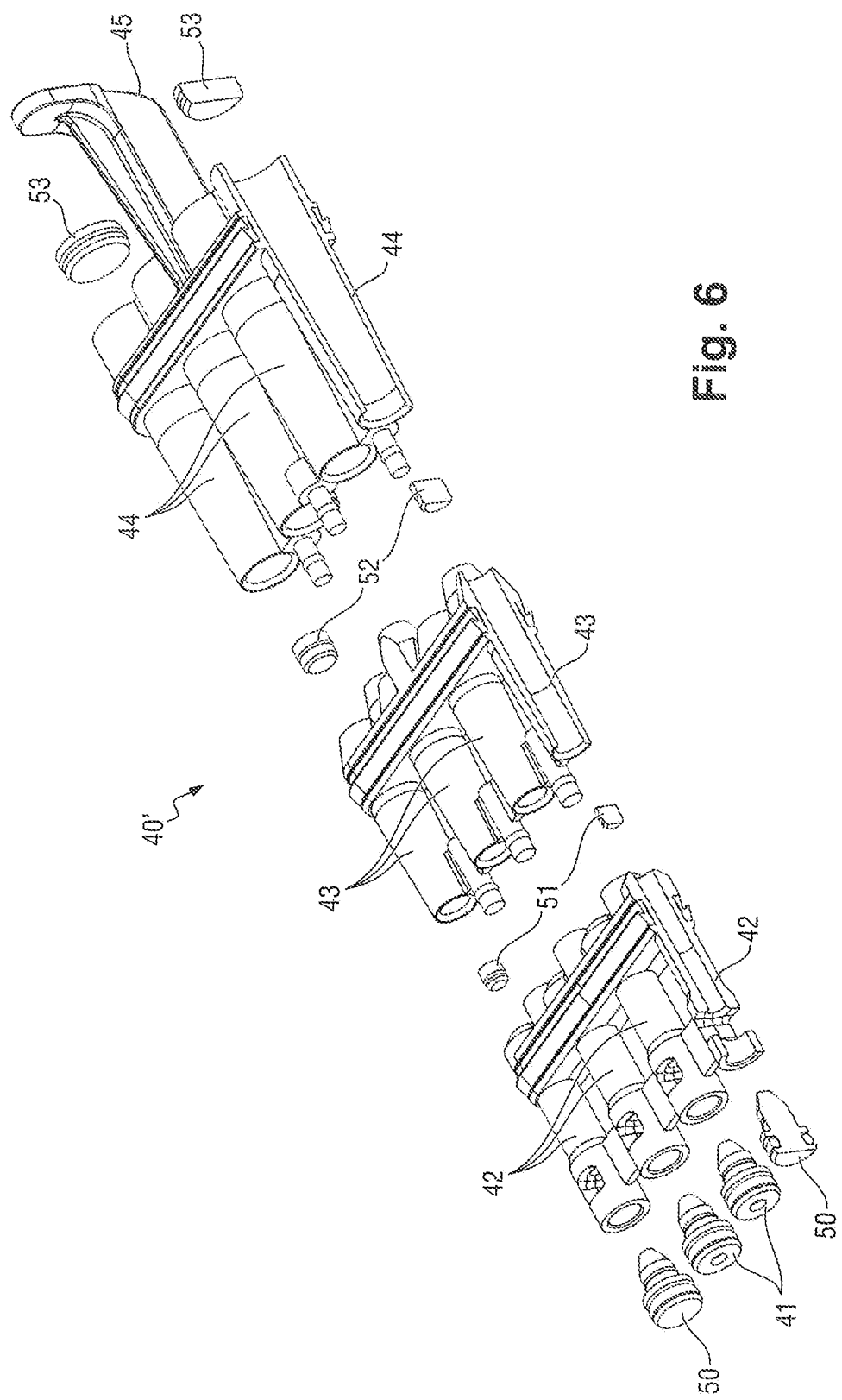
FIG. 6 is an exploded view of a variant of the cluster of multi-stage venturi cells illustrated in FIG. 4.

FIG. 6 illustrates a cluster 40' of venturi cells which is a variant of the cluster 40. The cluster 40' differs from the cluster 40 in that it comprises:
- a set of two first stoppers 50 sealingly inserted in the inlet orifices 42.3 of two of the first mixers 42 instead of the corresponding nozzles 41;
- a set of two second stoppers 51 sealingly inserted in the outlet orifices of said two first mixers 42;
- a set of two third stoppers 52 sealingly inserted in the outlet orifices of the two second mixers 43 extending facing said two first mixers 42; and
- a set of two fourth stoppers 53 sealingly inserted in the outlet orifices of the two third mixers 44 extending facing said two second mixers 43.

The stoppers 50, 51, 52, 53 prevent any fluid from passing through the channels 42.2, 43.2, 44.2 of the mixers 42, 43, 44 wherein said stoppers 50, 51, 52, 53 are inserted, in such a manner that the cluster 40' is only composed of two multi-stage venturi cells, and not four as is the case for the cluster 40. The stoppers 50, 51, 52, 53 thus make it possible to reduce the flow rates suctioned and consumed by the vacuum generator 1 by modulating the number of venturi cells.

Figure 7:
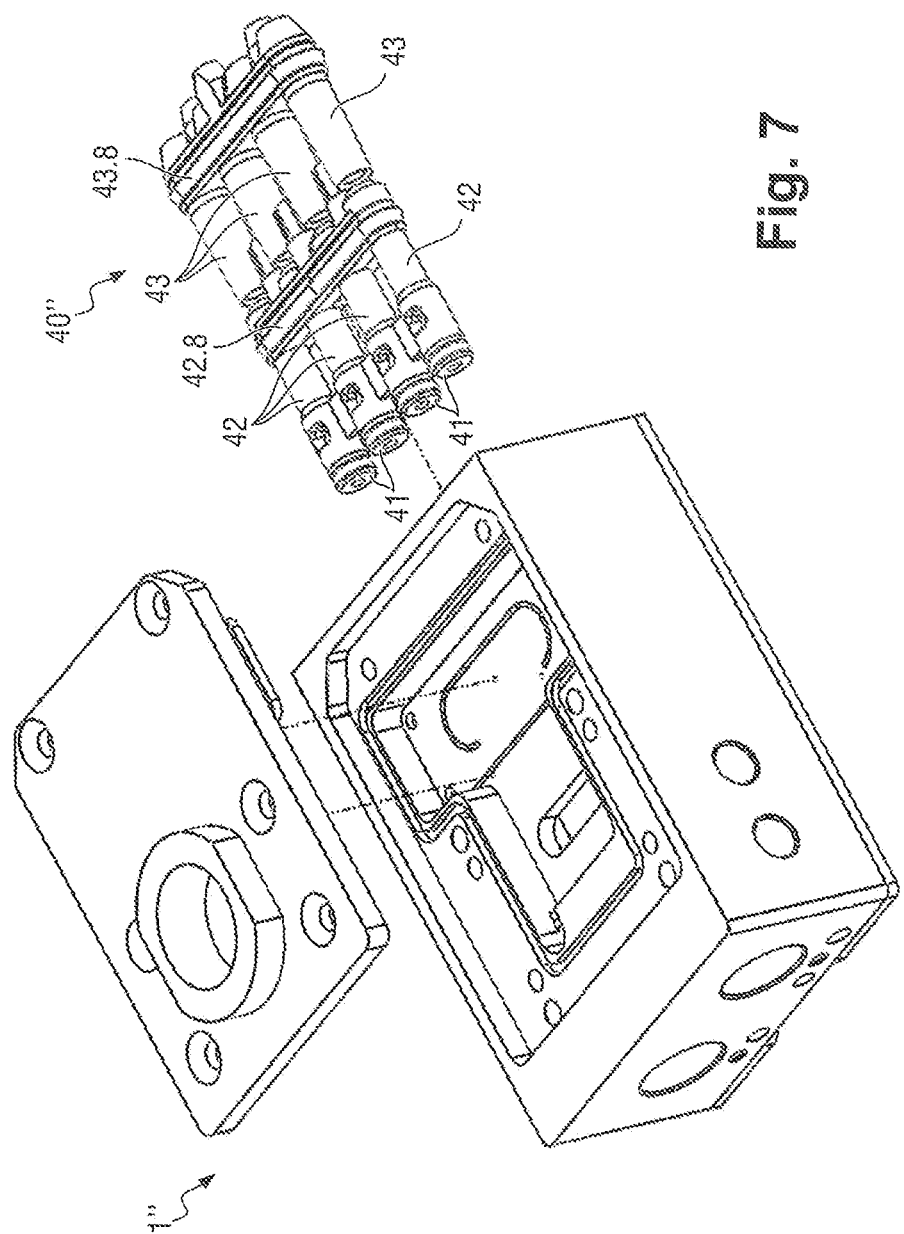
FIG. 7 is an exploded view of a variant of the multi-stage vacuum generator illustrated in FIG. 2.

FIG. 7 illustrates a vacuum generator 1" which is a variant of the vacuum generator 1. The vacuum generator 1" comprises a cluster 40" which differs from the cluster 40 of the vacuum generator 1 in that it does not comprise third mixers 44. The cluster 40" is constituted of nozzles 41, of the set of first mixers 42 and of the set of second mixers 43 forming four two-stage and not three-stage venturi cells, as is the case for the cluster 40.

Naturally, the invention is not limited to the embodiment described, but includes any variant entering into the field of the invention, such as defined by the claims.

The number of venturi cells constituting the cluster 40, 40" can be less than or greater than four.

The number of mixers constituting the venturi cells can be equal to one or be greater than three.

The number of mixers obstructed by stoppers can be less than or greater than two.

Although the mixers of each set extend, in this case, in one same plane by forming a row, they can also extend in different planes, to form, for example, a double row of superposed mixers or be disposed in order to form a cylinder.

Advantageously, the inlet orifices of the mixers can be provided, as illustrated in FIGS. 3 to 5, with a fillet making it possible to improve the suction performance of the venturi cells.

Advantageously also, the posts 43.5, 44.5 for indexing the sets of mixers can be arranged, as illustrated in FIGS. 3 to 5, to form poka-yoke-type notches, making it possible to avoid, in particular, the assembly of the third mixers with the first mixers.

The frames of the sets of mixers 42, 43, 44, and more specifically, the associated sealing surfaces 42.7, 43.7, 43.7, can have a shape different from that illustrated in the different figures: circular, rectangular, ovoid, etc.

Although the lip seals 42.8, 43.8, 44.8 are, in this case, carried by the frames of the sets of mixers 42, 43, 44, they can also be carried by the cylindrical orifices of the partitions 13, 14, 15.

Although the seals 42.8, 43.8, 44.8 are, in this case, lip seals, they can of a different nature: O-ring, etc.

The invention claimed is:

1. A vacuum generator comprising a bunch of multi-stage venturi cells, each multi-stage venturi cell of the bunch comprising:
 a nozzle sealingly secured in an inlet orifice of a first mixer provided with a first suction orifice; and
 a second mixer fixed to the first mixer, in such a manner that the second mixer extends coaxially to the first mixer and is spaced apart from an outlet orifice of said first mixer to form a second suction orifice with it,
 wherein the first mixers are firmly interconnected by a first frame extending between the first suction orifices and the outlet orifices of the first mixers, in order to form a first sealing surface surrounding all of the first mixers, and the second mixers are firmly interconnected by a second frame extending between inlet orifices and outlet orifices of the second mixers, in order to form a second sealing surface surrounding all of the second mixers.

2. The vacuum generator according to claim 1, wherein each multi-stage venturi cell of the bunch further comprises a third mixer fixed to the second mixer, in such a manner that the third mixer extends coaxially to the second mixer and is spaced apart from an outlet orifice of said second mixer to form a third suction orifice with it, the third mixers being firmly interconnected by a third frame extending between inlet orifices and outlet orifices of the third mixers, in order to form a third sealing surface surrounding all of the third mixers.

3. The vacuum generator according to claim 1, wherein the multi-stage venturi cells of the bunch extend parallel to one another.

4. The vacuum generator according to claim 3, wherein the multi-stage venturi cells of the bunch extend in one same plane.

5. The vacuum generator according to claim 1, comprising a first seal and a second seal respectively carried by the first frame and the second frame.

6. The vacuum generator according to claim 5, wherein the first seal and the second seal are lip seals.

7. The vacuum generator according to claim 5, comprising a casing, wherein the bunch of multi-stage venturi cells is inserted, the casing comprising partitions delimiting chambers provided with orifices which are passed through by said bunch, the first seal and the second seal ensuring the sealing between the chambers.

\* \* \* \* \*